(12) United States Patent
Jain et al.

(10) Patent No.: US 10,777,668 B2
(45) Date of Patent: Sep. 15, 2020

(54) BIPOLAR JUNCTION TRANSISTORS WITH A SELF-ALIGNED EMITTER AND BASE

(71) Applicant: GLOBALFOUNDRIES Inc., Grand Cayman (KY)

(72) Inventors: Vibhor Jain, Essex Junction, VT (US); John J. Pekarik, Underhill, VT (US); Qizhi Liu, Lexington, MA (US); Pernell Dongmo, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/106,344

(22) Filed: Aug. 21, 2018

(65) Prior Publication Data
US 2020/0066885 A1 Feb. 27, 2020

(51) Int. Cl.
*H01L 29/732* (2006.01)
*H01L 29/08* (2006.01)
*H01L 29/06* (2006.01)

(52) U.S. Cl.
CPC ........ *H01L 29/732* (2013.01); *H01L 29/0649* (2013.01); *H01L 29/0804* (2013.01)

(58) Field of Classification Search
CPC ... H01L 29/0817; H01L 29/0821–0826; H01L 29/1004; H01L 29/66234–66356; H01L 29/0649; H01L 29/0804; H01L 29/732; H01L 29/165; H01L 29/66242; H01L 29/7317; H01L 29/7375
See application file for complete search history.

(56) References Cited

U.S. PATENT DOCUMENTS

| | | | |
|---|---|---|---|
| 5,250,448 A | * | 10/1993 | Hamasaki ......... H01L 21/28525 257/E21.166 |
| 5,331,186 A | * | 7/1994 | Morizuka ............... H01L 21/28 257/198 |
| 5,773,350 A | * | 6/1998 | Herbert ............. H01L 29/66287 148/DIG. 10 |
| 5,962,880 A | * | 10/1999 | Oda .................... H01L 29/1004 250/214 A |
| 6,884,689 B2 | | 4/2005 | Chuang et al. |
| 6,972,443 B2 | | 12/2005 | Khater |
| 6,982,442 B2 | | 1/2006 | Chan et al. |
| 7,598,539 B2 | | 10/2009 | Wilhelm |
| 8,536,012 B2 | | 9/2013 | Camillo-Castillo et al. |
| 8,610,174 B2 | | 12/2013 | Adkisson et al. |
| 8,716,837 B2 | | 5/2014 | Camillo-Castillo et al. |
| 8,933,537 B2 | | 1/2015 | Fox et al. |
| 8,946,861 B2 | | 2/2015 | Camillo-Castillo et al. |
| 9,761,701 B2 | | 4/2017 | Boeck et al. |

(Continued)

*Primary Examiner* — Eric A. Ward
(74) *Attorney, Agent, or Firm* — Thompson Hine LLP; Anthony Canale (57) ABSTRACT

Device structures and fabrication methods for a bipolar junction transistor. A trench isolation region surrounds an active region that includes a collector. A base layer is arranged over the active region, and a semiconductor layer is arranged on the base layer. The semiconductor layer includes a stepped profile with a first section having a first width adjacent to the base layer and a second section having a second width that is less than the first width. An emitter is arranged on the second section of the semiconductor layer.

18 Claims, 8 Drawing Sheets

(56) References Cited

U.S. PATENT DOCUMENTS

| | | | | |
|---|---|---|---|---|
| 2007/0111459 A1* | 5/2007 | Suma | ............... | H01L 29/7378 |
| | | | | 438/309 |
| 2014/0246676 A1* | 9/2014 | Camillo-Castillo | ..................... | |
| | | | | H01L 29/66242 |
| | | | | 257/51 |
| 2014/0361300 A1* | 12/2014 | Camillo-Castillo | ..................... | |
| | | | | H01L 29/1004 |
| | | | | 257/51 |

\* cited by examiner

BIPOLAR JUNCTION TRANSISTORS WITH A SELF-ALIGNED EMITTER AND BASE

BACKGROUND

The invention relates generally to semiconductor device and integrated circuit fabrication and, in particular, to device structures and fabrication methods for a bipolar junction transistor.

A bipolar junction transistor is a three-terminal electronic device that includes an emitter, a collector, and an intrinsic base arranged between the emitter and collector. In a PNP bipolar junction transistor, the emitter and collector are composed of p-type semiconductor material, and the intrinsic base is composed of n-type semiconductor material. In an NPN bipolar junction transistor, the emitter and collector are composed of n-type semiconductor material, and the intrinsic base is composed of p-type semiconductor material. In operation, the base-emitter junction is forward biased, the base-collector junction is reverse biased, and the collector-emitter current may be controlled with the base-emitter voltage.

A heterojunction bipolar transistor is a variant of a bipolar junction transistor in which the semiconductor materials have different energy bandgaps, which creates heterojunctions. For example, the collector and/or emitter of a heterojunction bipolar transistor may be constituted by silicon, and the intrinsic base of a heterojunction bipolar transistor may be constituted by a silicon germanium (SiGe) alloy, which is characterized by a narrower band gap than silicon.

Conventional fabrication processes for a bipolar junction transistor may include multiple selective epitaxial growth operations to form the collector, intrinsic base, and emitter, as well as an extrinsic base used to contact the intrinsic base. The multiple selective epitaxial growth operations tend to elevate the manufacturing cost and lengthen the manufacturing process.

Improved structures and fabrication methods for a bipolar junction transistor are needed.

SUMMARY

In an embodiment of the invention, a device structure is provided for a bipolar junction transistor. The device structure includes a trench isolation region surrounding an active region, a collector in the active region, a base layer arranged over the active region, and a semiconductor layer arranged on the base layer. The semiconductor layer includes a stepped profile with a first section having a first width adjacent to the base layer and a second section having a second width that is less than the first width. An emitter is arranged on the second section of the semiconductor layer.

In an embodiment of the invention, a device structure is provided for a bipolar junction transistor. The device structure includes a trench isolation region surrounding an active region, a collector in the active region, a base layer arranged over the active region, a semiconductor layer on the base layer, and an emitter arranged on the semiconductor layer. The device structure further includes a sidewall spacer on the semiconductor layer and surrounding the emitter. The sidewall spacer is arranged relative to the semiconductor layer such that a portion of the semiconductor layer projects laterally beyond the sidewall spacer. The device structure further includes an extrinsic base layer having a first section arranged on the portion of the semiconductor layer and a second section arranged on the base layer.

In an embodiment of the invention, a method is provided for forming a bipolar junction transistor. The method includes forming a trench isolation region surrounding an active region and a collector in the active region, epitaxially growing a base layer over the active region, and epitaxially growing a semiconductor layer on the base layer. The semiconductor layer includes a stepped profile with a first section having a first width adjacent to the base layer and a second section having a second width that is less than the first width. The method further includes forming an emitter that is arranged on the second section of the semiconductor layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
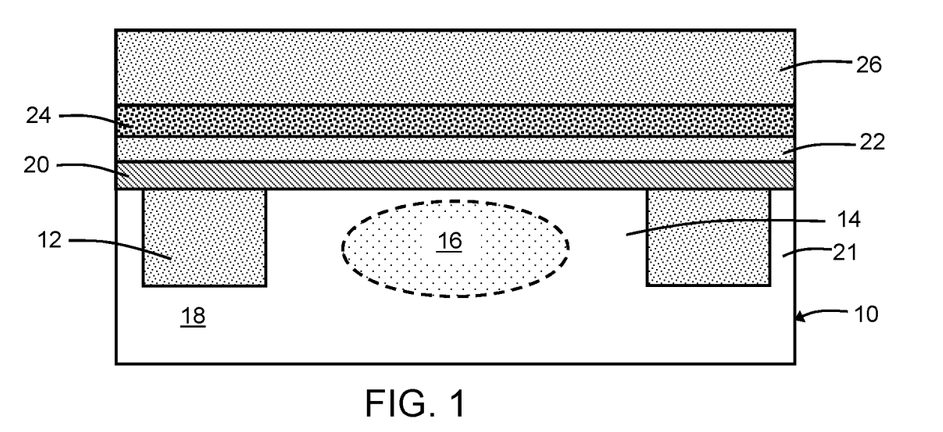
FIGS. 1-9 are cross-sectional views of a device structure at successive fabrication stages of a processing method in accordance with embodiments of the invention.

With reference to FIG. 1 and in accordance with embodiments of the invention, a substrate 10 is composed of a single-crystal semiconductor material suitable for the fabrication of the device structures of an integrated circuit. The semiconductor material constituting the substrate 10 may include an epitaxial layer at its top surface, and the epitaxial layer may be doped with an electrically-active dopant to alter its electrical conductivity. For example, an epitaxial layer of single-crystal silicon may be epitaxially grown on the substrate 10 and doped with an n-type dopant from Group V of the Periodic Table (e.g., phosphorus (P), arsenic (As), and/or antimony (Sb)) to provide n-type conductivity.

A trench isolation region 12 is formed in the substrate 10 and surrounds a section of the substrate 10 to define an active region 14. The active region 14 is arranged interior of the trench isolation region 12. The trench isolation region 12 may be formed by a shallow trench isolation (STI) technique that relies on a lithography and dry etching process to define trenches in the substrate 10, deposits a dielectric material to overfill the trenches, and planarizes the dielectric material using chemical mechanical polishing (CMP) to remove dielectric material from the field. The dielectric material may be composed of an electrical insulator, such as an oxide of silicon (e.g., silicon dioxide ($SiO_2$)), deposited by chemical vapor deposition (CVD).

A collector 16 is arranged in the active region 14 and may constitute all or a portion of the active region 14. The electrical conductivity of the collector 16 may be elevated relative to the substrate 10 by, for example, selectively implanting a dopant, such as an n-type dopant, into a central portion of the active region 14. A subcollector 18 extends laterally in the substrate 10 beneath the trench isolation region 12 in order to couple the collector 16 with a collector contact region 21, which is arranged outside of the trench isolation region 12. The subcollector 18 may be formed beneath the top surface of the substrate 10 by introducing an electrically-active dopant, such as an impurity species from Group V of the Periodic Table (e.g., phosphorus (P), arsenic (As), and/or antimony (Sb)) to produce n-type conductivity. In one embodiment, the subcollector 18 may be formed in the substrate 10 by a masked high-current ion implantation followed by a high-temperature thermal anneal.

A base layer 20 is formed over the active region 14 and the trench isolation region 12. The base layer 20 may be composed of a semiconductor material, such as silicon-germanium (SiGe) including silicon (Si) and germanium (Ge) combined in an alloy with the silicon content ranging from 95 atomic percent to 50 atomic percent and the germanium content ranging from 5 atomic percent to 50 atomic percent. The germanium content of the base layer 20 may be uniform, or may be graded and/or stepped across its thickness. The base layer 20 may be doped with a concentration of a dopant, such as a p-type dopant from Group III of the Periodic Table (e.g., boron (B) and/or indium (In)) to provide p-type conductivity. The base layer 20 may be formed using an epitaxial growth process. The base layer 20 may include single-crystal semiconductor material epitaxially grown on the active region 14, and polycrystalline semiconductor material that forms over the trench isolation region 12. The crystal structure of the single-crystal semiconductor material of the active region 14 serves as a crystalline template for the growth of the crystal structure of the single-crystal semiconductor material of the base layer 20, whereas the trench isolation region 12 does not provide any type of crystalline template to support single-crystal growth.

Dielectric layers 22, 24, 26 are arranged in a multilayer stack over the base layer 20. The dielectric layer 22 may be composed of a dielectric material, such as a high temperature oxide (HTO) deposited by rapid thermal oxidation (RTO) or chemical vapor deposition. The dielectric layer 24 may be composed of a dielectric material, such as silicon nitride ($Si_3N_4$), deposited by atomic layer deposition (ALD) or chemical vapor deposition. The dielectric layer 26 may be composed of a dielectric material, such as silicon dioxide ($SiO_2$), deposited by atomic layer deposition or chemical vapor deposition.

Figure 2:
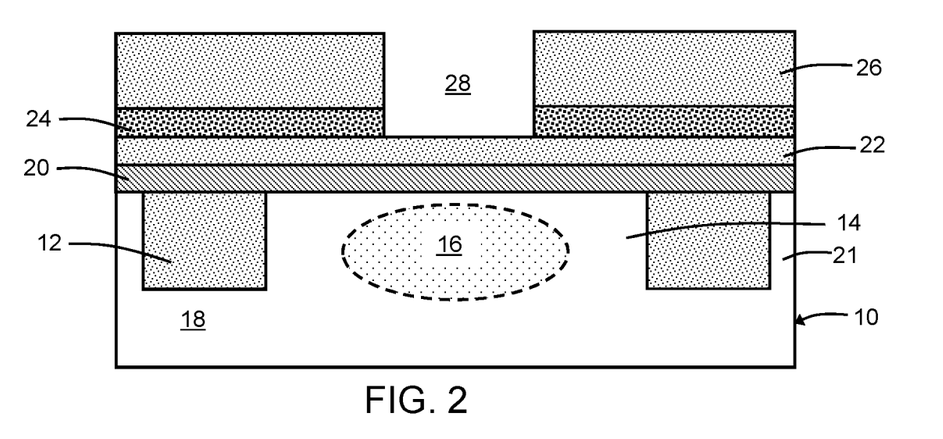

With reference to FIG. 2 in which like reference numerals refer to like features in FIG. 1 and at a subsequent fabrication stage of the processing method, the dielectric layers 24, 26 are patterned using lithography and etching processes to define an emitter opening 28, which is aligned with the section of the base layer 20 over the active region 14. The etching process, which may be a reactive ion etching (ME) process, may stop on the dielectric layer 22 after penetrating through the dielectric layer 24.

Figure 3:
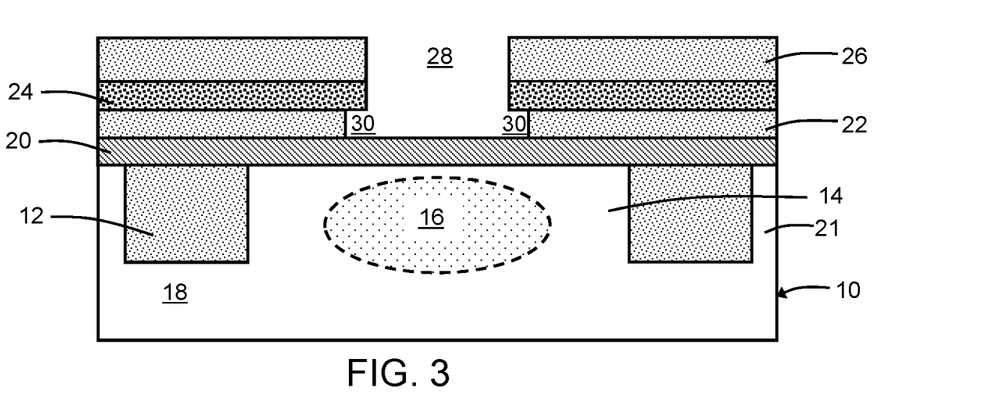

With reference to FIG. 3 in which like reference numerals refer to like features in FIG. 2 and at a subsequent fabrication stage of the processing method, the emitter opening 28 is extended through the dielectric layer 22 using an etching process, such as reactive ion etching. The etching process may stop on the base layer 20 after penetrating through the dielectric layer 22. A cavity 30 is then formed between the base layer 20 and the dielectric layer 24 by laterally etching the dielectric layer 22 with an isotropic etching process that removes the material of the dielectric layer 22 selective to the materials of the base layer 20 and the dielectric layer 24. In an embodiment, the etching process may be a wet chemical etching process. As used herein, the terms "selective" and "selectivity" in reference to a material removal process (e.g., etching) denote that the material removal rate (i.e., etch rate) for the targeted material is higher than the material removal rate (i.e., etch rate) for at least another material exposed to the material removal process. The dielectric layer 26 may be thinned by the etching process forming the cavity 30.

Figure 4:
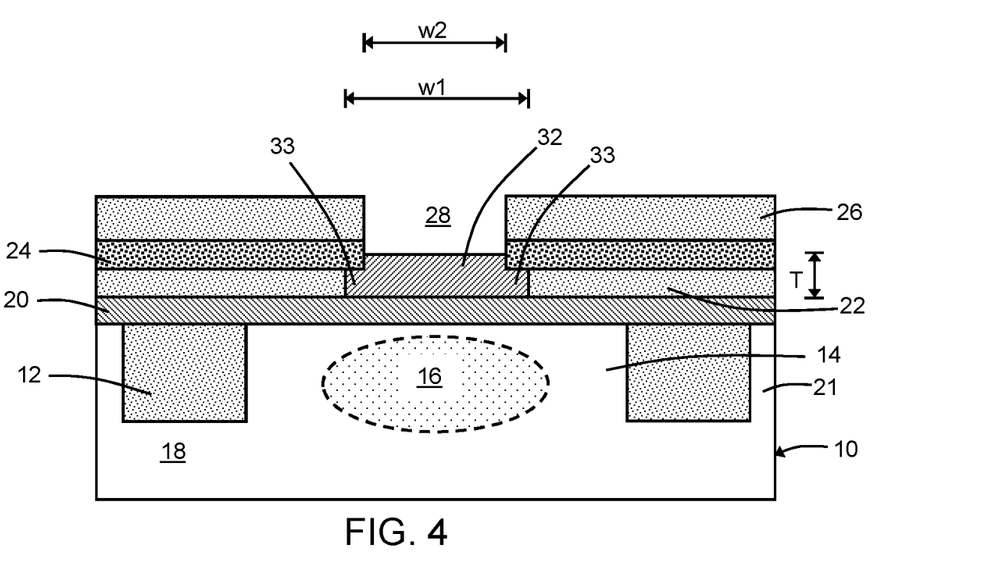

With reference to FIG. 4 in which like reference numerals refer to like features in FIG. 3 and at a subsequent fabrication stage of the processing method, a semiconductor layer 32 is formed on the surface of the base layer 20 over the active region 14 in a lower portion of the emitter opening 28 and inside the cavity 30. The semiconductor layer 32 may be composed of single-crystal semiconductor material, such as single-crystal silicon, grown by an epitaxial growth process. The side edges of the dielectric layers 22, 24, 26 bordering the sidewalls of the emitter opening 28 spatially constrain the epitaxial growth. In an embodiment, the semiconductor layer 32 may be formed by a selective epitaxial growth (SEG) process in which semiconductor material nucleates for epitaxial growth on semiconductor surfaces such as the single-crystal substrate 10, but does not nucleate for epitaxial growth from insulator surfaces, such as the top surface of the dielectric layer 26 and the side edges of the dielectric layers 22, 24, 26 bordering the sidewalls of the emitter opening 28. The semiconductor layer 32 may be composed of an undoped or intrinsic semiconductor material, such as intrinsic silicon. In alternative embodiments, the semiconductor layer 32 may be lightly doped with either an n-type dopant or a p-type dopant, or may have regions of both undoped and lightly doped semiconductor material.

The semiconductor layer 32 has a staggered or stepped profile with sections of different widths. The semiconductor layer 32 includes an upper section having a width, w1, and a lower section having a width, w2, that is less than width, w1. The narrower section of the semiconductor layer 32 is arranged over the wider section of the semiconductor layer 32. The wider section of the semiconductor layer 32 is arranged at the level of the dielectric layer 22 and is widened due to the filling of the cavity 30. The width difference between the sections of the semiconductor layer 32 results in a portion 33 of the lower section that projects laterally into the cavity 30. The wider lower section of the semiconductor layer 32 includes the portion 33 of the semiconductor layer 32, which provides the increased width relative to the narrower upper section of the semiconductor layer 32.

The semiconductor layer 32 has a bottom surface that may be in direct contact with the base layer 20 and a top surface opposite to the bottom surface. The thickness, T, of the semiconductor layer 32 is greater than the thickness of the dielectric layer 22 and is less than the total thickness of the dielectric layer 22 and the dielectric layer 24. In particular, the thickness of the semiconductor layer 32 is selected such that the top surface of the semiconductor layer 32 extends or projects above the horizontal interface between the dielectric layer 22 and the dielectric layer 24, and the top surface of the semiconductor layer 32 is arranged below the horizontal interface between the dielectric layer 24 and the dielectric layer 26.

Figure 5:
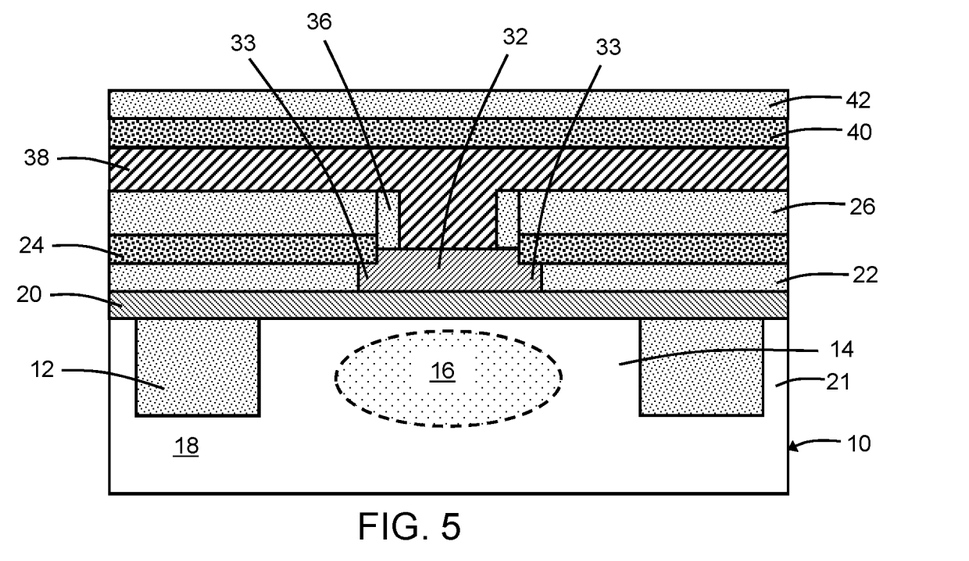

With reference to FIG. 5 in which like reference numerals refer to like features in FIG. 4 and at a subsequent fabrication stage of the processing method, a sidewall spacer 36 is formed that extends about the outer perimeter of the sidewall of the emitter opening 28 over the semiconductor layer 32. The sidewall spacer 36 may be composed of one or more dielectric materials deposited as a conformal layer by atomic layer deposition or chemical vapor deposition and etched with a directional etching process, such as reactive ion etching. For example, the sidewall spacer 36 may be a bilayer spacer composed of silicon dioxide and silicon nitride, or composed of silicon dioxide and polysilicon. As another example, the sidewall spacer 36 may be a bilayer spacer that includes silicon dioxide and another dielectric material, such as silicon nitride.

An emitter layer 38 is formed by depositing a semiconductor layer that fills the space inside the emitter opening 28 over the semiconductor layer 32 and interior of the sidewall spacer 36, and that covers the dielectric layer 26 in the field adjacent to the emitter opening 28. The emitter layer 38 may be composed of polycrystalline semiconductor material, such as polycrystalline silicon, deposited by chemical vapor deposition. In an embodiment, the semiconductor material constituting the emitter layer 38 may be heavily doped with an n-type dopant from Group V of the Periodic Table (e.g., phosphorus (P) and/or arsenic (As)) to provide n-type conductivity. The emitter layer 38 is not formed by selective epitaxial growth.

Dielectric layers 40, 42 are formed over the emitter layer 38. The dielectric layer 40 may be composed of silicon nitride deposited by chemical vapor deposition. The dielectric layer 42 may be composed of silicon dioxide deposited by chemical vapor deposition.

Figure 6:
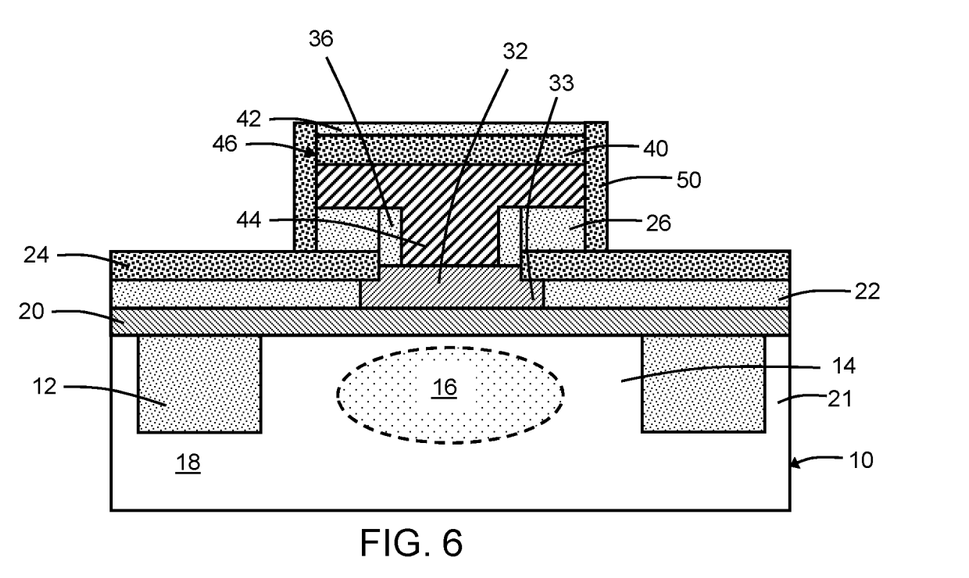

With reference to FIG. 6 in which like reference numerals refer to like features in FIG. 5 and at a subsequent fabrication stage of the processing method, an emitter 44 and an emitter cap 46 are respectively patterned from the emitter layer 38 and the dielectric layers 40, 42 with a lithography and etching process in which the etching process, which may be reactive ion etching, stops on the material of the dielectric layer 24. The dielectric layer 26 is also patterned such that a segment of the dielectric layer 26 is preserved as a remnant beneath the head of the T-shaped emitter 44.

A sidewall spacer 50 is formed that extends about the outer perimeter of the sidewalls of the emitter 44, emitter cap 46, and the remnant of the dielectric layer 26. The sidewall spacer 50 is formed on a portion of the dielectric layer 24. The sidewall spacer 50 may be composed of a dielectric material, such as silicon nitride, that is deposited as a conformal layer by atomic layer deposition and etched with a directional etching process, such as reactive ion etching.

Figure 7:
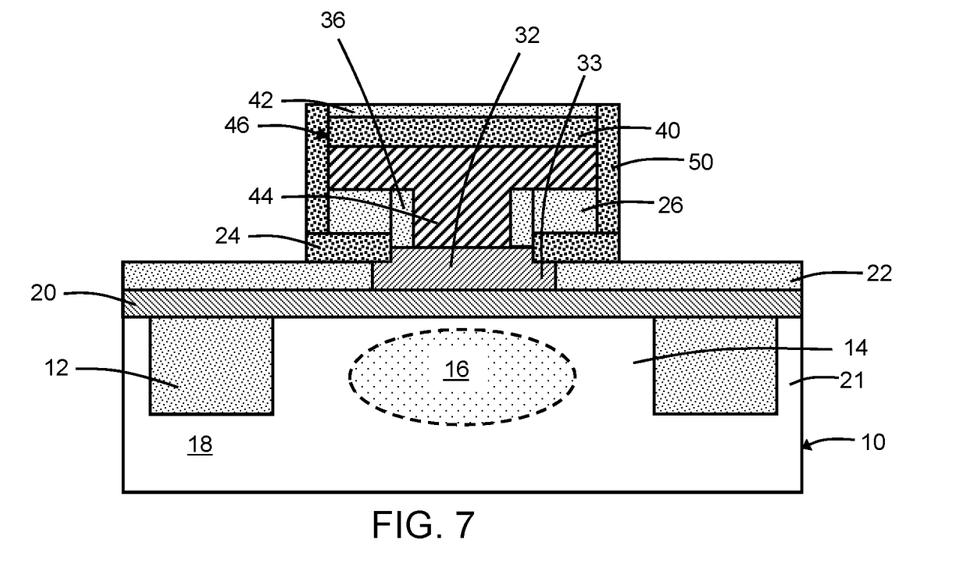

With reference to FIG. 7 in which like reference numerals refer to like features in FIG. 6 and at a subsequent fabrication stage of the processing method, the dielectric layer 24 is removed from the dielectric layer 22 over areas that are outside of the sidewall spacer 50 with an etching process. The etching process may be an anisotropic etching process, such as reactive ion etching, in which the dielectric layer 22 functions as an etch stop, and may be a continuation of the etching process forming the sidewall spacer 50. The dielectric layer 22 is exposed by the removal of the dielectric layer 24.

Figure 8:
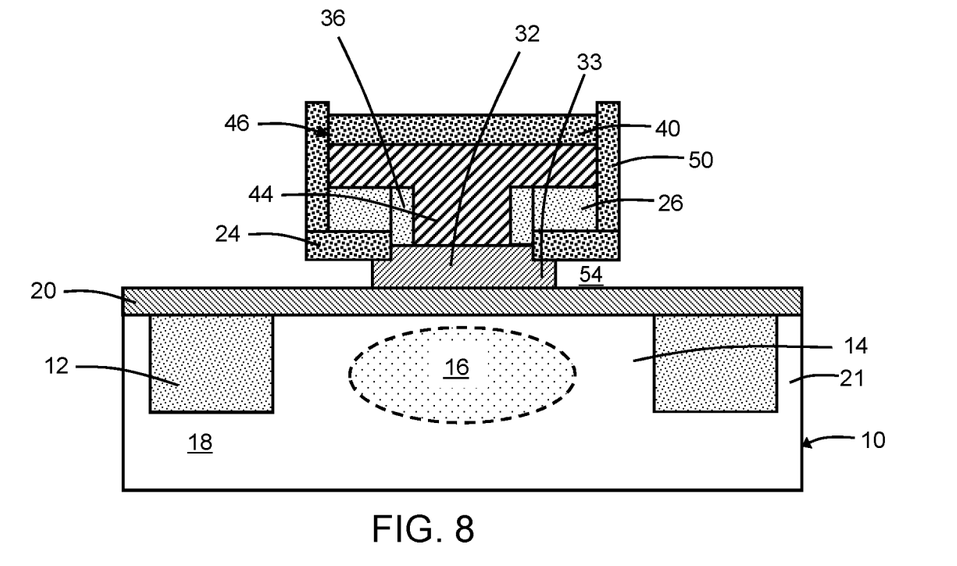

With reference to FIG. 8 in which like reference numerals refer to like features in FIG. 7 and at a subsequent fabrication stage of the processing method, an isotropic etching process, such as a wet chemical etching process, is used to remove the dielectric layer 22 selective to the dielectric layer 24 and the sidewall spacer 50. A cavity 54 is defined by the removal of the dielectric layer 22 between the base layer 20 and the dielectric layer 24. The cavity extends in a lateral direction to the semiconductor layer 32, which operates as an etch stop for the etching process removing the dielectric layer 22. The dielectric layer 42 forming a portion of the emitter cap 46 is also removed by the etching process to expose the dielectric layer 40 of the emitter cap 46. The step in the semiconductor layer 32, the sidewall spacer 50, and the dielectric layer 24 contribute to collectively protect the sidewall spacer 36 during the etching process. The sidewall spacer 36 may contain silicon dioxide having the same etch selectivity as the removed dielectric layer 22.

Figure 9:
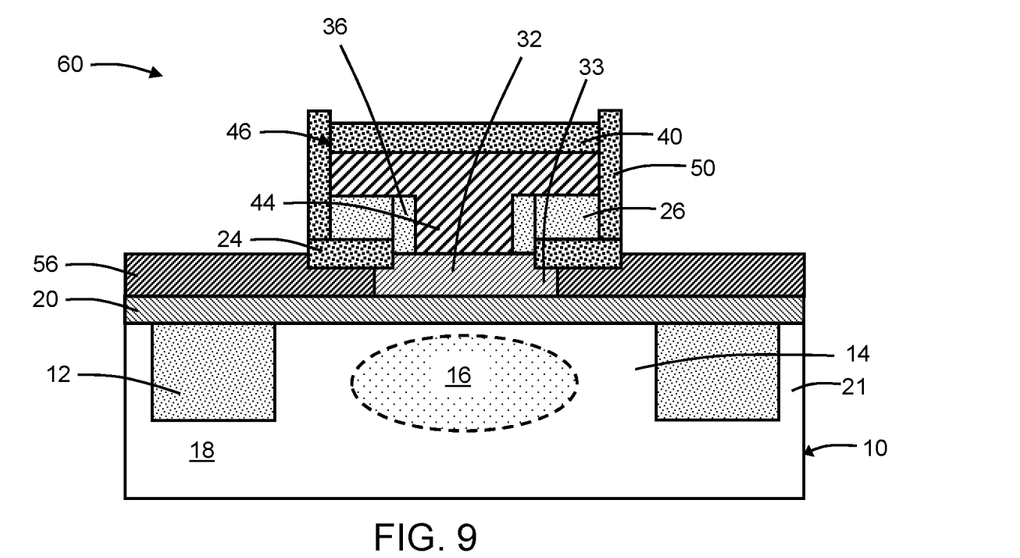

With reference to FIG. 9 in which like reference numerals refer to like features in FIG. 8 and at a subsequent fabrication stage of the processing method, an extrinsic base layer 56 is formed over the base layer 20, including a portion that is arranged within the space inside the cavity 54. In an embodiment, the extrinsic base layer 56 may be composed of a semiconductor material (e.g., silicon or silicon-germanium) formed by a selective epitaxial growth (SEG) deposition process, such as low pressure chemical vapor deposition. If the extrinsic base layer 56 is composed of silicon-germanium, the concentration of germanium may have a graded or an abrupt profile, and may include additional layers, such as one or more silicon caps. In a selective epitaxial growth process, nucleation of the constituent semiconductor material is suppressed on insulators, such as on the emitter cap 46 and sidewall spacer 50. The extrinsic base layer 56 may be in situ doped during epitaxial growth with a concentration of one or more dopants, such as a dopant from Group III of the Periodic Table (e.g., boron (B) and/or indium (In)) and/or a Group IV species (e.g., carbon (C), silicon (Si), and/or germanium (Ge)).

The extrinsic base layer 56 has a directly contacting relationship with base layer 20 and with the portion 33 of the wider lower section of the semiconductor layer 32. The extrinsic base layer 56 is spaced from, and has a non-contacting relationship with, the narrower upper section of the semiconductor layer 32. The dielectric layer 26 intervenes between the portion of the semiconductor layer 32 in the cavity 54 and the narrower upper section of the semiconductor layer 32. The portion of the extrinsic base layer 56 inside the cavity 54 has a thickness that is less than the thickness, T, of the semiconductor layer 32.

The device structure of a bipolar junction transistor 60 has a vertical architecture that includes the collector 16, the emitter 44, the semiconductor layer 32, and an intrinsic base provided by the base layer 20 that are arranged vertically between the emitter 44 and collector 16 with the semiconductor layer 32 intervening between the emitter 44 and collector 16. In an embodiment, the semiconductor layer 32 may be considered to be a portion of the emitter 44. Junctions are arranged between the emitter 44 and the intrinsic base, and between the intrinsic base and the collector 16. The device structure of the bipolar junction transistor 60 can be divided into an intrinsic region that includes the junctions, and an extrinsic region that is arranged outside of the intrinsic region.

The bipolar junction transistor 60 further includes the extrinsic base layer 56 that is used to contact the intrinsic base. The extrinsic base layer 56 is in direct contact with a portion of the base layer 20 in the extrinsic region, and is indirectly connected by the semiconductor layer 32 with a portion of the base layer 20 forming the intrinsic base in the intrinsic region.

Middle-of-line processing and back-end-of-line processing follow, which includes formation of contacts, vias, and wiring for an interconnect structure that is coupled with the bipolar junction transistor 60.

The staggered or stepped profile of the semiconductor layer 32 may contribute to controlling diffusion of dopant from the emitter 44 into the intrinsic base of the bipolar junction transistor 60. The staggered or stepped profile of the semiconductor layer 32 separates the extrinsic base layer 56 from the emitter 44, and decouples the diffusion of dopant from the extrinsic base layer 56 into the intrinsic base from the diffusion of dopant of a different conductivity type from the emitter 44 into the intrinsic base. The staggered or stepped profile of the semiconductor layer 32 may serve as an etch stop for pre-cleans of the base layer 20 in some integration schemes.

The embodiments of the invention may simplify the self-aligned fabrication process compared with existing self-aligned fabrication processes, thereby reducing cost and reducing cycle time. As a consequence of an improved connection between the extrinsic base layer 56 and the intrinsic base, the bipolar junction transistor 60 may be characterized by a lower base resistance and a higher maximum oscillation frequency ($f_{max}$). The improved and independent control over the emitter diffusion may reduce the base-emitter capacitance, and thereby provide a higher cut-off frequency ($f_T$) at low bias, which may lead to less consumed power for equivalent device performance.

The bipolar junction transistor 60 may be fabricated with fewer masks than in conventional self-aligned fabrication processes. Specifically, the extrinsic base layer 56 may be self-aligned to the emitter 44 without the need for an epitaxially-grown emitter 44.

Figure 10:
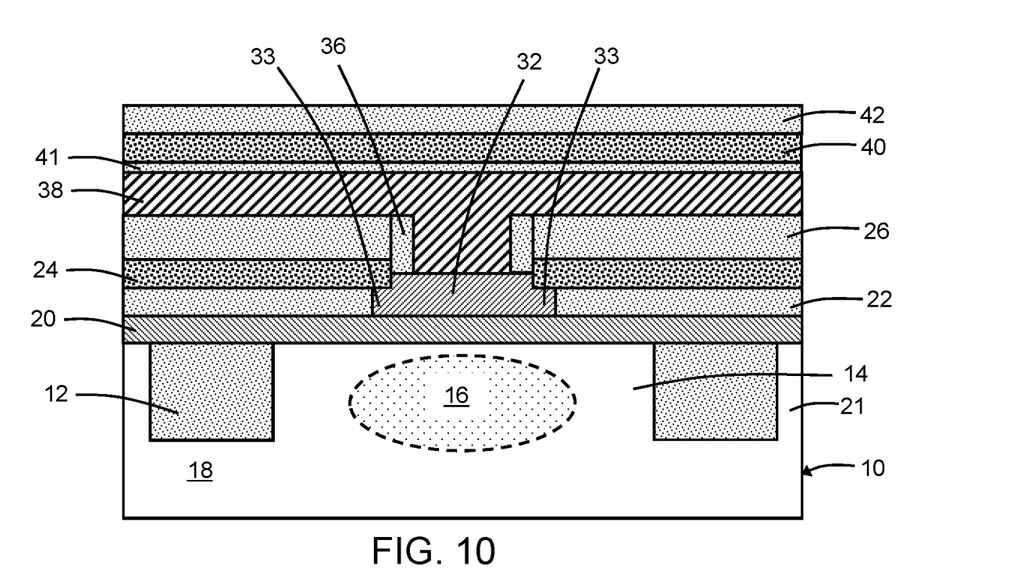
FIGS. 10-13 are cross-sectional views of a device structure at successive fabrication stages of a processing method in accordance with embodiments of the invention.

With reference to FIG. 10 in which like reference numerals refer to like features in FIG. 4 and in accordance with alternative embodiments, an additional dielectric layer 41 may be formed over the emitter layer 38 after the emitter layer 38 is formed and before the dielectric layers 40, 42 are formed. The dielectric layer 41 may be composed of silicon dioxide that is deposited by chemical vapor deposition.

Figure 11:
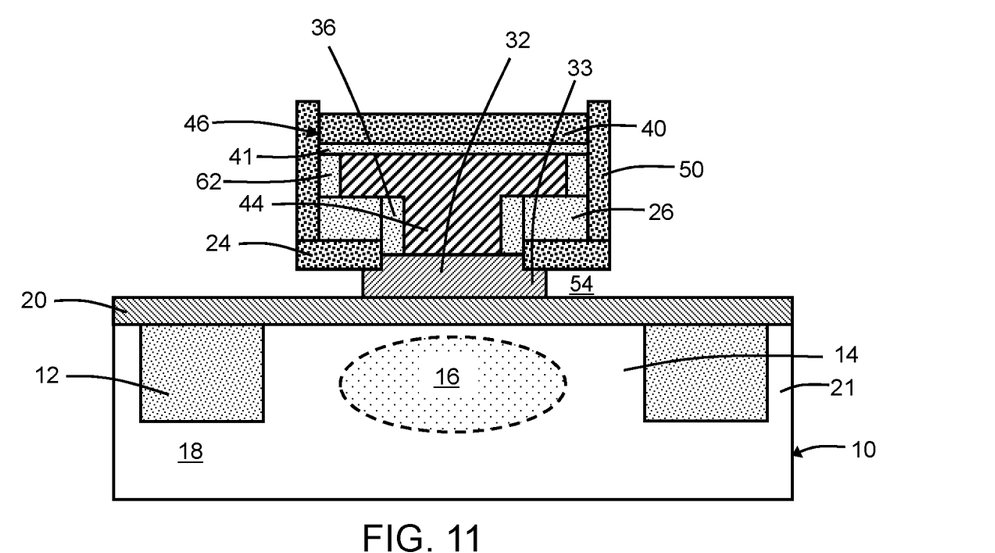

With reference to FIG. 11 in which like reference numerals refer to like features in FIG. 10 and at a subsequent fabrication stage of the processing method, processing continues with the fabrication stages through the fabrication stage of FIG. 8. Before the sidewall spacer 50 is formed, a spacer 62 is formed at the edges of the head of the T-shaped emitter 44. The spacer 62 may be composed of silicon dioxide grown by high pressure oxidation of the semiconductor material of the emitter layer 38.

Figure 12:
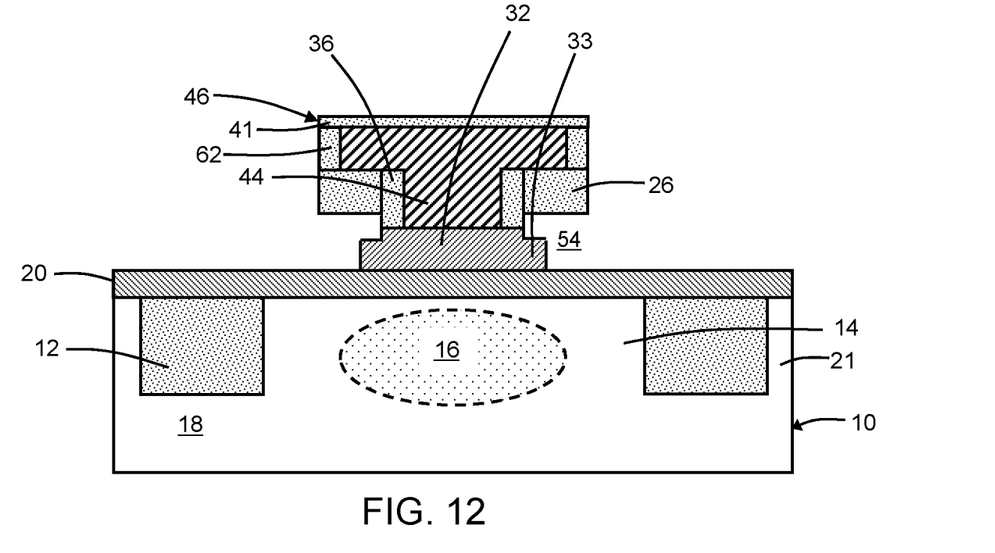

With reference to FIG. 12 in which like reference numerals refer to like features in FIG. 11 and at a subsequent fabrication stage of the processing method, the dielectric layer 24, the dielectric layer 42 of the emitter cap 46, and the sidewall spacer 50 are removed with an etching process that removes their materials selective to the materials of the dielectric layer 26, the spacer 62, the dielectric layer 41, the base layer 20, and the semiconductor layer 32. The dielectric layer 26, the spacer 62, and the dielectric layer 41 surround and protect the emitter 44 during the etching process. In an embodiment, the etching process may be a wet chemical etching process using a heated solution containing phosphoric acid ($H_3PO_4$) that removes silicon nitride selective to silicon dioxide. The volume of cavity 54 is increased because the etching process removes the dielectric layer 24.

Figure 13:
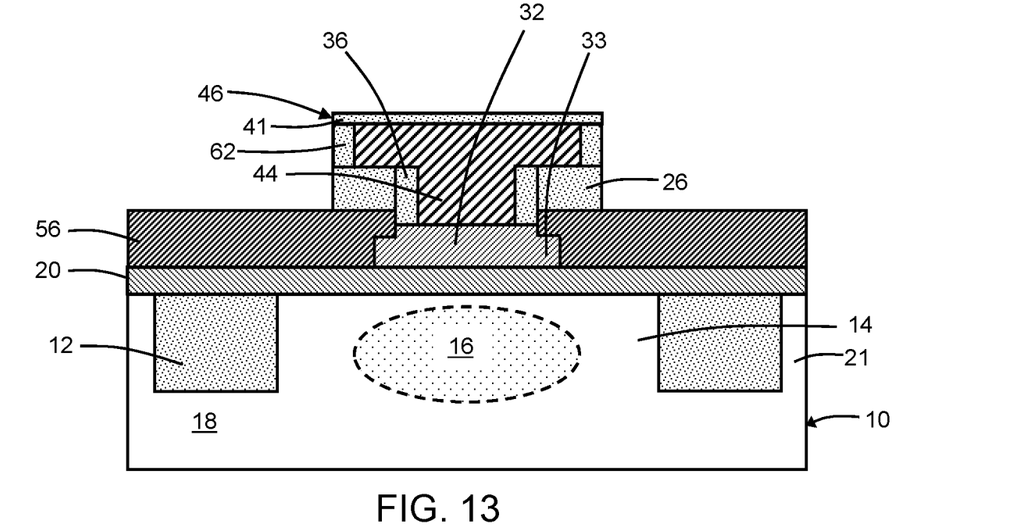

With reference to FIG. 13 in which like reference numerals refer to like features in FIG. 12 and at a subsequent fabrication stage of the processing method, processing continues as described in FIG. 9 to form the extrinsic base layer 56 on the base layer 20, including the space inside the cavity 54. The extrinsic base layer 56 has a directly-contacting relationship with both the wide section and the narrow section of the semiconductor layer 32, which also provides the extrinsic base layer 56 with a stepped profile as a result of the underlying topography of the semiconductor layer 32. A portion of the extrinsic base layer 56 overlies the portion 33 of the semiconductor layer 32. The portion of the extrinsic base layer 56 inside the cavity 54 has a thickness that is greater than the thickness, T, of the semiconductor layer 32.

Figure 14:
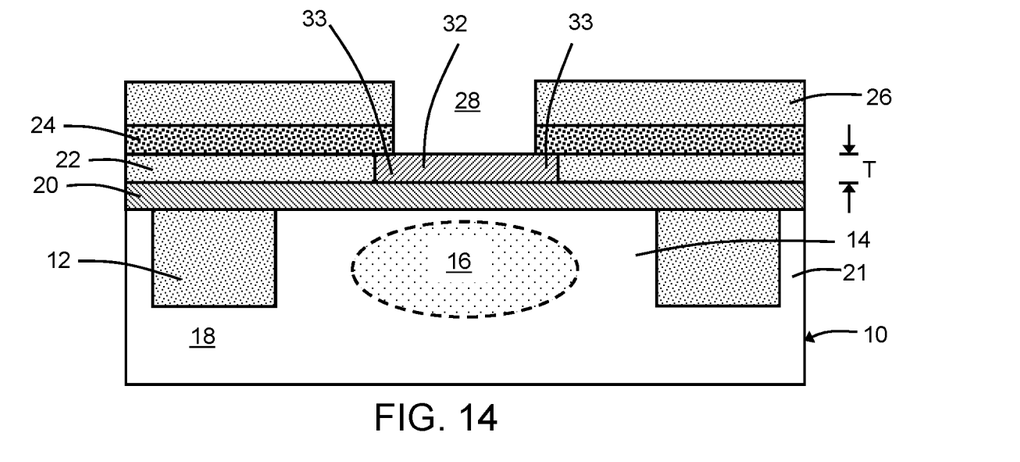
FIGS. 14-16 are cross-sectional views of a device structure at successive fabrication stages of a processing method in accordance with embodiments of the invention.

With reference to FIG. 14 in which like reference numerals refer to like features in FIG. 4 and in accordance with alternative embodiments, the semiconductor layer 32 is formed with a smaller thickness on the surface of the active region 14 in the lower portion of the emitter opening 28 and inside the cavity 30. The semiconductor layer 32 lacks a stepped profile and only includes a section having the width, w1. The thickness, T, of the semiconductor layer 32 is less than or equal to the thickness of the dielectric layer 22 such that the semiconductor layer 32 is arranged at or below the interface between the dielectric layer 22 and the dielectric layer 24. In an embodiment, the thickness, T, of the semiconductor layer 32 may be equal to the thickness of the dielectric layer 22 such that a top surface of the semiconductor layer 32 is coplanar with the interface between the dielectric layer 22 and the dielectric layer 24.

Figure 15:
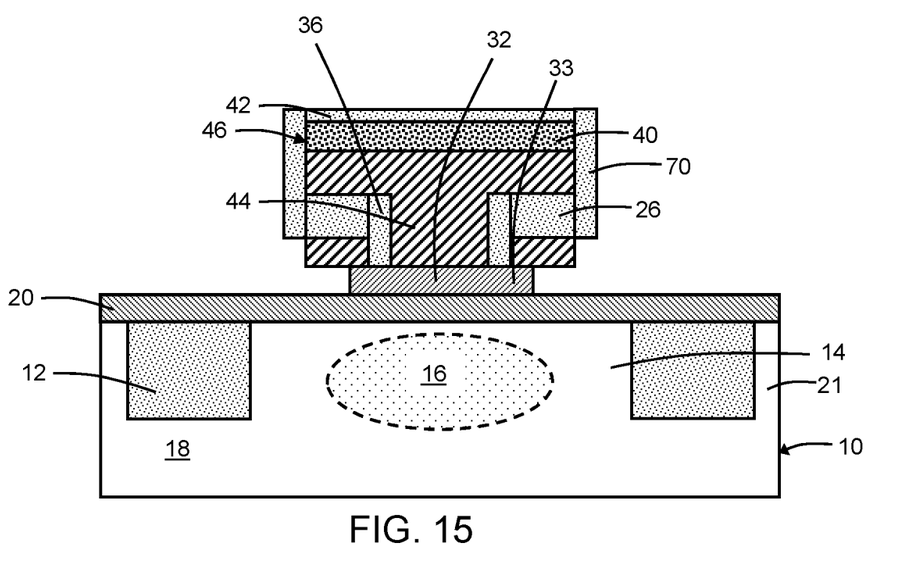

With reference to FIG. 15 in which like reference numerals refer to like features in FIG. 14 and at a subsequent fabrication stage of the processing method, processing continues as described in FIGS. 5 and 6. The sidewall spacer 50 is not formed, but instead a sidewall spacer 70 is formed that is composed of a different material than the dielectric layer 24. In particular, the sidewall spacer 70 may be formed by directionally etching a conformal dielectric layer composed of silicon dioxide ($SiO_2$) that is deposited by atomic layer deposition.

Figure 16:
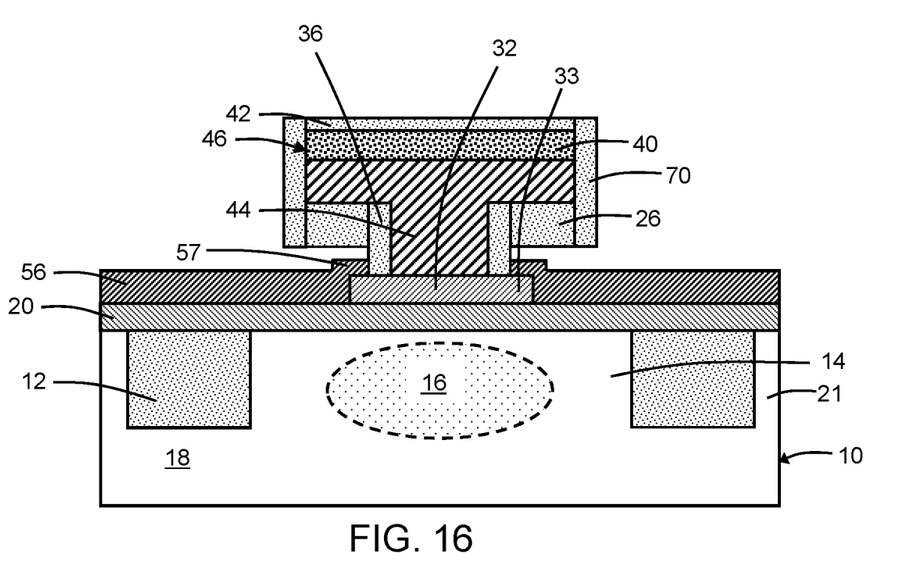

With reference to FIG. 16 in which like reference numerals refer to like features in FIG. 15 and at a subsequent fabrication stage of the processing method, the dielectric layer 24 is removed with an etching process that removes its material selective to the materials of the dielectric layer 22, the sidewall spacer 36, the dielectric layer 42 of the emitter cap 46, and the semiconductor layer 32. In an embodiment, the etching process may be a wet chemical etching process using a heated solution containing phosphoric acid ($H_3PO_4$) that removes silicon nitride selective to silicon dioxide.

The dielectric layer 22 is removed with an etching process that also removes the dielectric layer 42 of the emitter cap 46. In an embodiment, the etching process may be a wet chemical etching process using a solution containing hydrofluoric acid (HF) that removes silicon dioxide selective to silicon nitride. The silicon dioxide of the sidewall spacer 70 may be formed with a thickness that is greater than the thickness of the dielectric layer 22 and may be formed by, for example, rapid thermal oxidation.

The extrinsic base layer 56 is epitaxially grown as described in the context of FIG. 9. The side edge of the semiconductor layer 32 projects from beneath the sidewall spacer 36. The extrinsic base layer 56 has a portion, generally indicated by reference numeral 57, that acquires a step shape when epitaxially grown due to the projecting edge of the semiconductor layer 32. The projecting edge of the semiconductor layer 32 supplies a topography with a step over which the extrinsic base layer 56 is formed and that the portion 57 of the extrinsic base layer 56 acquires.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure for a bipolar junction transistor, the device structure comprising:
    a trench isolation region surrounding an active region;
    a collector in the active region;
    a base layer arranged over the active region;
    a semiconductor layer on the base layer, the semiconductor layer comprised of an intrinsic semiconductor material, the semiconductor layer including a stepped profile with a first section adjacent to the base layer and a second section separated from the base layer by the first section, the second section having a topmost surface, the first section having a first width, and the second section having a second width that is less than the first width; and
    an emitter directly connected to the topmost surface of the second section of the semiconductor layer.

2. The device structure of claim 1 wherein the emitter has a third width, and the first width and the second width are each greater than the third width.

3. The device structure of claim 1 wherein the base layer includes a second portion that is arranged on the first section of the semiconductor layer, and further comprising:
    an extrinsic base layer on the second portion of the base layer surrounding the semiconductor layer,
    wherein the semiconductor layer is arranged laterally between the extrinsic base layer and the emitter.

4. The device structure of claim 3 further comprising:
    a dielectric layer arranged over the first section and the second section of the semiconductor layer, the dielectric layer spaced in a vertical direction from the base layer to define a cavity that receives a portion of the extrinsic base layer,
    wherein the portion of the extrinsic base layer has a first thickness inside the cavity, the semiconductor layer has a second thickness that is less than the first thickness, and the extrinsic base layer is in direct contact with the first section and the second section of the semiconductor layer.

5. The device structure of claim 3 further comprising:
    a dielectric layer arranged over the first section and the second section of the semiconductor layer, the dielectric layer spaced in a vertical direction from the base layer to define a cavity that receives a portion of the extrinsic base layer,
    wherein the extrinsic base layer has a first thickness inside the cavity, the semiconductor layer has a second thickness that is greater than the first thickness, and the dielectric layer is laterally positioned between the second section of the semiconductor layer and the extrinsic base layer such that the extrinsic base layer is spaced from the second section of the semiconductor layer.

6. The device structure of claim 5 wherein the extrinsic base layer has a non-contacting relationship with the second section of the semiconductor layer.

7. The device structure of claim 3 wherein the extrinsic base layer is in direct contact with the first section of the semiconductor layer.

8. The device structure of claim 7 wherein the extrinsic base layer is in direct contact with the second section of the semiconductor layer.

9. The device structure of claim 3 wherein the emitter is T-shaped with a head, and further comprising:
    an emitter cap over the head of the emitter;
    a dielectric layer arranged over the first section and the second section of the semiconductor layer, the dielectric layer spaced in a vertical direction from the base layer to define a cavity that receives a portion of the extrinsic base layer; and
    a sidewall spacer on a portion of the dielectric layer, the sidewall spacer extending from the portion of the dielectric layer to the emitter cap.

10. The device structure of claim 1 wherein the first section of the semiconductor layer has a bottommost surface in direct contact with the base layer.

11. A device structure for a bipolar junction transistor, the device structure comprising:
    a trench isolation region surrounding an active region;
    a collector in the active region;
    a base layer arranged over the active region;
    a semiconductor layer on the base layer, the semiconductor layer comprised of a p-type semiconductor material, the semiconductor layer including a stepped profile with a first section adjacent to the base layer and a second section separated from the base layer by the first section, the second section having a topmost surface, the first section having a first width, and the second section having a second width that is less than the first width;
    an emitter directly connected to the topmost surface of the second section of the semiconductor layer;
    a sidewall spacer on the semiconductor layer and surrounding the emitter, the sidewall spacer arranged relative to the semiconductor layer such that a portion of the semiconductor layer projects laterally beyond the sidewall spacer; and an extrinsic base layer having a first section arranged on the portion of the semiconductor layer and a second section arranged on the base layer.

12. The device structure of claim 11 further comprising:
a dielectric layer arranged over at least the first section of the semiconductor layer, the dielectric layer spaced in a vertical direction from the base layer to define a cavity that receives the first section of the extrinsic base layer.

13. The device structure of claim 11 wherein the first section of the semiconductor layer has a bottommost surface in direct contact with the base layer.

14. A method of formed a bipolar junction transistor, the method comprising:
   forming a trench isolation region surrounding an active region and a collector in the active region;
   forming a base layer over the active region;
   forming a semiconductor layer on the base layer; and
   forming an emitter arranged over the semiconductor layer and the base layer,
   wherein the semiconductor layer comprised of an intrinsic semiconductor material, the semiconductor layer includes a stepped profile having a first section adjacent to the base layer and a second section separated from the base layer by the first section, the emitter is directly connected to a topmost surface of the second section of the semiconductor layer, the first section has a first width, and the second section has a second width that is less than the first width.

15. The method of claim 14 wherein the emitter is arranged on the second section of the semiconductor layer.

16. The method of claim 14 wherein a portion of the emitter is in direct contact with a portion of the base layer, and further comprising:
   forming a sidewall spacer on the second section of the semiconductor layer and surrounding the portion of the emitter,
   wherein the sidewall spacer is comprised of silicon dioxide.

17. The method of claim 14 wherein the base layer is formed by a first epitaxial growth process, the semiconductor layer is formed by a second epitaxial growth process, and further comprising:
   forming an extrinsic base layer by a third epitaxial growth process on a portion of the base layer surrounding the semiconductor layer,
   wherein the semiconductor layer is arranged laterally between the extrinsic base layer and the emitter.

18. The method of claim 17 further comprising:
   forming a sidewall spacer surrounding the emitter and arranged over the extrinsic base layer,
   wherein the sidewall spacer is comprised of silicon nitride or silicon dioxide.

\* \* \* \* \*